(12) United States Patent
Flachowsky et al.

(10) Patent No.: US 9,214,396 B1
(45) Date of Patent: Dec. 15, 2015

(54) TRANSISTOR WITH EMBEDDED STRESS-INDUCING LAYERS

(71) Applicant: GLOBALFOUNDRIES Inc., Grand Cayman (KY)

(72) Inventors: Stefan Flachowsky, Dresden (DE); Jan Hoentschel, Dresden (DE); Gerd Zschaetzsch, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/294,467

(22) Filed: Jun. 3, 2014

(51) Int. Cl.
| | |
|---|---|
| *H01L 21/8238* | (2006.01) |
| *H01L 29/78* | (2006.01) |
| *H01L 29/161* | (2006.01) |
| *H01L 29/165* | (2006.01) |
| *H01L 29/66* | (2006.01) |
| *H01L 21/02* | (2006.01) |
| *H01L 21/762* | (2006.01) |
| *H01L 29/06* | (2006.01) |
| *H01L 29/45* | (2006.01) |
| *H01L 21/285* | (2006.01) |
| *H01L 21/265* | (2006.01) |

(52) U.S. Cl.
CPC .. *H01L 21/823814* (2013.01); *H01L 21/02532* (2013.01); *H01L 21/26513* (2013.01); *H01L 21/28518* (2013.01); *H01L 21/76224* (2013.01); *H01L 29/0653* (2013.01); *H01L 29/161* (2013.01); *H01L 29/165* (2013.01); *H01L 29/456* (2013.01); *H01L 29/665* (2013.01); *H01L 29/6656* (2013.01); *H01L 29/66636* (2013.01); *H01L 29/7848* (2013.01)

(58) Field of Classification Search
CPC ................. H01L 21/823814; H01L 21/8238
USPC .................... 438/199, 495; 257/344, 369
See application file for complete search history.

(56) References Cited

U.S. PATENT DOCUMENTS

| 6,593,217 B1 * | 7/2003 | Fujisawa ................. 438/495 |
|---|---|---|
| 2012/0231591 A1 * | 9/2012 | Flachowsky et al. ......... 438/231 |

* cited by examiner

*Primary Examiner* — Theresa T Doan
(74) *Attorney, Agent, or Firm* — Amerson Law Firm, PLLC

(57) ABSTRACT

A method of forming a transistor device is provided, including the subsequently performed steps of forming a gate electrode on a first semiconductor layer, forming an interlayer dielectric over the gate electrode and the first semiconductor layer, forming a first opening in the interlayer dielectric at a predetermined distance laterally spaced from the gate electrode on one side of the gate electrode and a second opening in the interlayer dielectric at a predetermined distance laterally spaced from the gate electrode on another side of the gate electrode, the first and second openings reaching to the first semiconductor layer, forming cavities in the first semiconductor layer through the first and second openings formed in the interlayer dielectric, and forming embedded second semiconductor layers in the cavities.

20 Claims, 3 Drawing Sheets

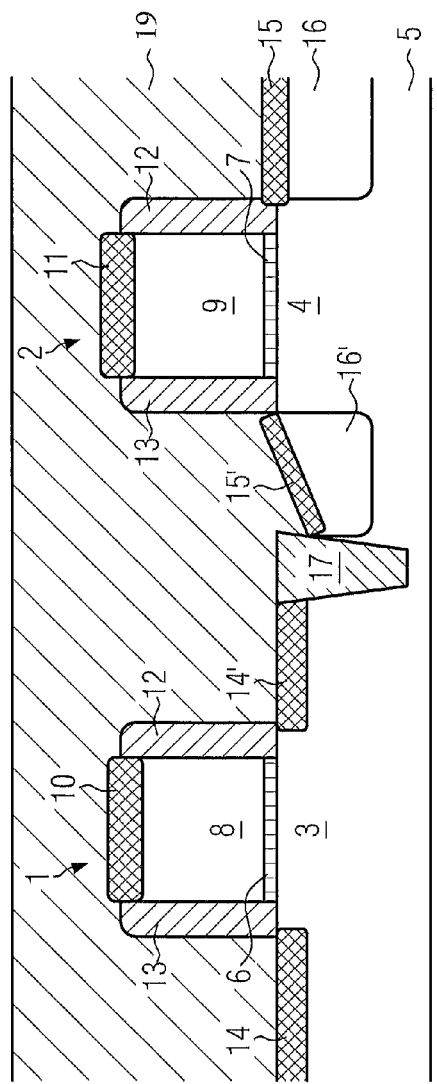
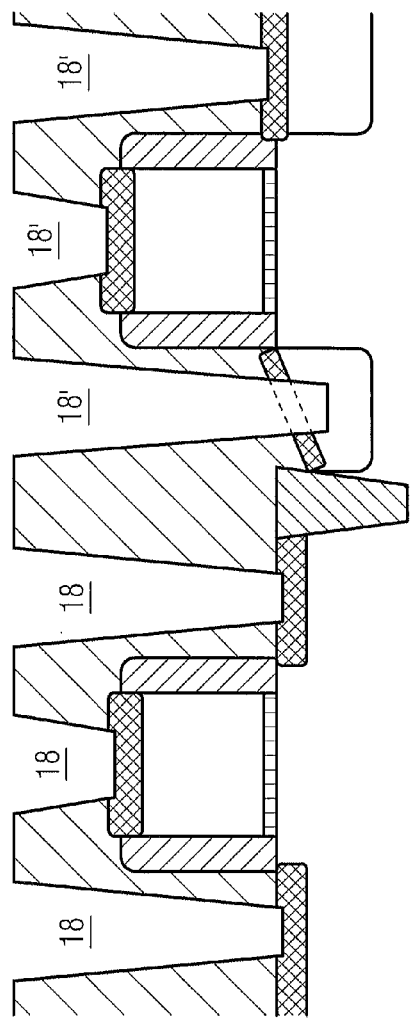
FIG. 1a (Prior Art)
FIG. 1b (Prior Art)

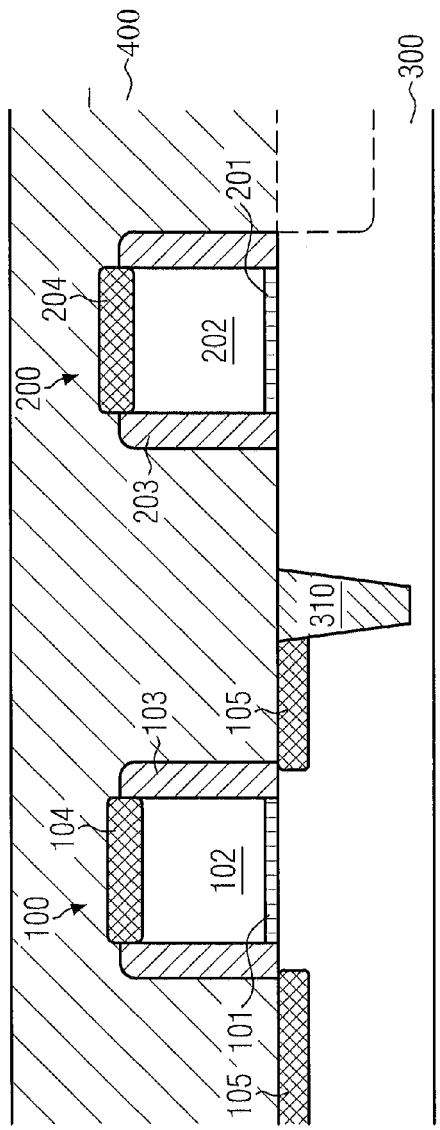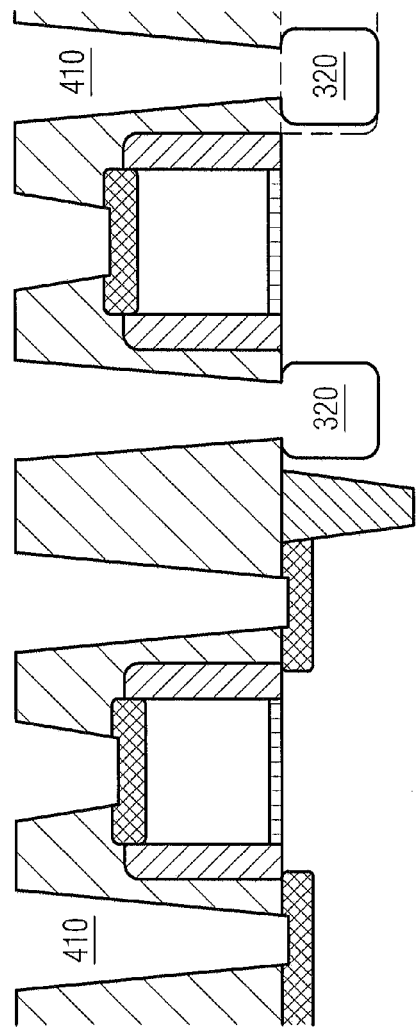
FIG. 2a
FIG. 2b

TRANSISTOR WITH EMBEDDED STRESS-INDUCING LAYERS

BACKGROUND OF THE INVENTION

1. Field of the Invention

Generally, the present disclosure relates to the field of integrated circuits and semiconductor devices, and, more particularly, to the formation of a transistor device having embedded stress-inducing layers in the source and drain regions adjacent to the channel region.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in the conductivity. On the other hand, compressive strain in the channel region may increase the mobility of holes, thereby providing the potential for enhancing the performance of P-type transistors.

Particularly, it has been proposed to introduce a silicon/germanium layer next to the channel region to induce a compressive stress that may result in a corresponding strain. The strained silicon/germanium compound, which may also be referred to as a silicon/germanium alloy, may be provided in a strained state due to a mismatch of the lattice spacing between natural silicon and natural silicon/germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. The transistor performance of P-channel transistors may be considerably enhanced by the introduction of stress-creating layers next to the channel region. For this purpose, a strained silicon/germanium layer may be formed in the drain and source regions of the transistors, wherein the compressively strained drain and source regions create uniaxial strain in the adjacent silicon channel region. When forming the silicon/germanium layer, the drain and source regions of the PMOS transistors are selectively recessed, while the NMOS transistors are masked and subsequently the silicon/germanium layer is selectively formed in the PMOS transistor by epitaxial growth.

However, a particular problem arises when using the embedded silicon/germanium technique in the context of CMOS manufacturing and silicidated source/drain regions, as illustrated in FIGS. 1a and 1b. The conductivity of doped silicon-based semiconductor regions may be increased by providing a metal silicide therein in order to reduce overall sheet resistance and contact resistivity. For example, the drain and source regions may receive a metal silicide, such as nickel silicide, nickel platinum silicide and the like, thereby reducing the overall series resistance of the conductive path between the drain and source terminals and the intermediate channel region.

FIG. 1a shows a P-channel transistor 1 and an N-channel transistor 2 with channel regions 3 and 4 formed in a silicon layer 5. Each of the transistors 1 and 2 comprises a gate dielectric 6, 7, a gate layer 8, 9 and a silicidated top layer 10, 11, as well as sidewall spacers 12, 13. Moreover, each of the transistors 1 and 2 comprises a silicidated source (drain)

region 14, 15 and a silicidated drain (source) region 14', 15'. The P-channel transistor 2 comprises embedded silicon/germanium regions 16, 16' as described above. They are doped in order to function as source/drain electrodes of the P-channel transistor 2. The transistor devices 1 and 2 are separated from each other by a shallow trench isolation (STI) 17 and covered by an interlayer dielectric 19.

As shown in FIG. 1a, the silicon/germanium material does not properly grow at the STI edge. Consequently, some "ski-sloped" area arises at the silicon-STI interface in the silicon layer 5. Since the silicon/germanium material does not properly grow at the STI edge, silicidation cannot properly be carried out. The silicon material of the silicon/germanium compound 16' formed in the vicinity of the STI 17 (on the "ski-slope") is too thin to allow for growing of the silicide material to an appropriate thickness. In a later manufacturing state, contact openings 18, 18' are formed in the interlayer dielectric 19 for contacting the source/drain regions, as shown in FIG. 1b.

Since the silicide material 15' is not grown thickly enough, problems with contact landing arise. Particularly, the contact opening etch may not reliably stop on the silicide and etching deeply into the silicon/germanium compound 16' may occur. Unconnected contacts that are formed in the contact opening 18' formed above the sloped silicidated silicon/germanium compound 16' may, therefore, cause device failures.

In view of the situation described above, the present disclosure provides techniques that allow for the formation of silicidated embedded semiconductor material adjacent to the channel region of a transistor within the CMOS manufacturing process that allow for a uniform growth of an embedded semiconductor material (for example, a silicon/germanium compound) even in the vicinity of an STI.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of the formation of a transistor device includes the subsequently performed steps of forming a gate electrode on a first semiconductor layer, forming an interlayer dielectric over the gate electrode and the first semiconductor layer, forming a first opening in the interlayer dielectric at a predetermined distance laterally spaced from the gate electrode on one side of the gate electrode and a second opening in the interlayer dielectric at a predetermined distance laterally spaced from the gate electrode on another side of the gate electrode, the first and second openings reaching to the first semiconductor layer, forming cavities in the first semiconductor layer through the first and second openings formed in the interlayer dielectric, and forming embedded second semiconductor layers in the cavities. The transistor device may be an N-channel or P-channel FET.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b illustrate a method of the formation of embedded silicon/germanium as known in the art; and FIGS. 2a-2d illustrate a method of the formation of embedded silicon/germanium according to an example of the present invention.

Figure 2C:
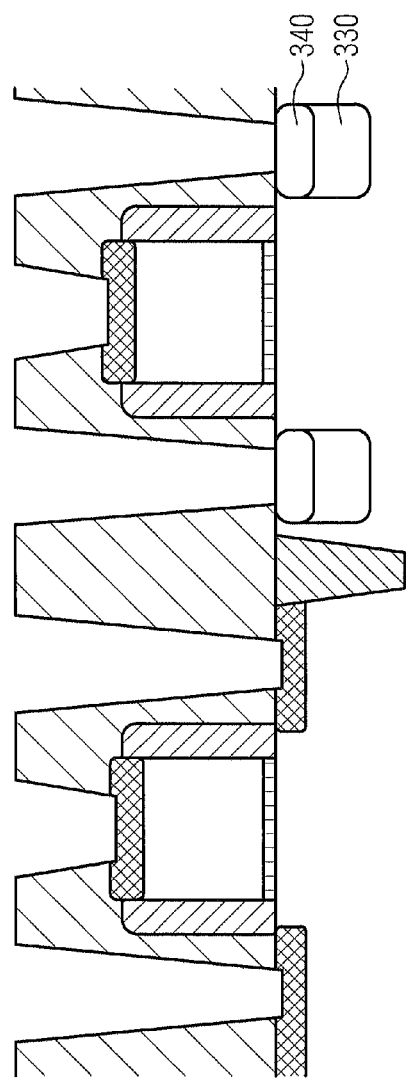

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various embodiments of the invention are described below. In the interest of clarity, not all features of actual implementations are described in the specification. It will, of course, be appreciated that, in the development of any such actual embodiments, numerous implementations and specific decisions must be made to achieve the developer's specific goals, such as compliance with system-related and business-related constraints, which will vary from one implementation to another. Moreover, it will be appreciated that such a development might, therefore, be complex and time consuming, but would nevertheless be a routine undertaking for those of ordinary skill in the art having the benefits of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it will be apparent that the embodiments of the disclosure may be practiced without the specific details. In order to avoid obscuring the present disclosure, some well-known circuits, system configurations, structure configurations and process steps are not disclosed in detail.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, integrated circuits comprising inductors.

The present disclosure generally provides methods for stress/strain transfer in the channel region of a transistor, thereby increasing the mobility of charge carriers and the overall performance of the transistor. The stress/strain transfer may be achieved by a lattice mismatch between a first semiconductor material, for example, doped silicon, in a channel region of the transistor and an embedded second semiconductor material formed in a source/drain region of the transistor.

An example of an inventive method in the context of CMOS manufacturing will now be described with reference to FIGS. 2a-2d. FIG. 2a shows a manufacturing stage wherein an N-channel transistor 100 and an intermediate P-channel transistor 200 are formed in and on a semiconductor layer 300.

The semiconductor layer 300 may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the semiconductor layer 300 may be part of an SOI configuration, i.e., it may be formed on a buried oxide layer which is formed on a semiconductor substrate. The semiconductor substrate may be a silicon substrate, in particular, a single crystal silicon substrate. Other materials may be used to form the semiconductor substrate such as, for example, germanium, silicon/germanium, gallium phosphate, gallium arsenide, etc.

In principle, the semiconductor layer 300 may comprise a strained silicon material provided by, for instance, growing silicon on a relaxed silicon/germanium (Si/Ge) alloy, which has a greater lattice constant compared to natural silicon, thereby resulting in a bi-axial tensile strain in the re-grown silicon material, which may thus enable enhancement of P-channel transistors and N-channel transistors due to the bi-axial nature of the strain.

The N-channel transistor 100 and the intermediate P-channel transistor 200 are separated from each other by a shallow trench isolation 310 formed by etching an opening in the semiconductor layer 300 and filling the same with some (field) oxide. Formation of both the N-channel transistor 100 and the intermediate P-channel transistor 200 comprises formation of a stack of gate materials and etching of the same, as is well known in the art. Thus, each of the transistors 100 and 200 comprises a gate dielectric 101, 201 and a gate electrode material 102, 202. The gate dielectric material may be comprised of silicon dioxide, silicon nitride, a combination thereof, or any appropriate high-k dielectric material, possibly in combination with one or more of the conventional dielectrics mentioned before. In this respect, a high-k dielectric material may be understood as a dielectric material having a relative permittivity of approximately 10 or higher. For example, a plurality of metal oxides may provide required insulating characteristics and may have a moderately high dielectric constant, such as hafnium oxide, zirconium oxide, aluminum oxide and the like. For example, a high-k dielectric material layer may be provided in the dielectric layers 101, 201, possibly in combination with a "conventional" dielectric material, such as a silicon dioxide base material, and the like. In sophisticated applications, the conventional dielectric layer, if provided, may have a thickness of 1 nm or less, while the high-k dielectric material layer may have a thickness of one to several nanometers. The dielectric layers 101, 201 may be formed by oxidation and/or chemical vapor deposition.

The gate electrode material 102, 202 may comprise a metal-containing layer formed on the dielectric layer 101, 201. The metal-containing layer may comprise at least one of titanium nitride (TiN), tantalum nitride (TaN), tantalum (Ta), tungsten (W), for example. The metal-containing layer may be relatively thin with a thickness below 50 nm, in particular, below 20 nm. The gate electrode material 102, 202 may comprise a semiconductor layer, for example, comprising silicon, above the metal-containing layer. The semiconductor layer of the gate electrode material 102, 202 may comprise undoped polycrystalline silicon. At the sidewalls of the gate electrode materials 102, 202, sidewall spacers 103 and 203 are formed. The sidewall spacers 103 and 203 may be formed of silicon nitride or silicon oxide, for example. Formation of the sidewall spacers 103 and 203 may comprise forming a dielectric layer over the gate electrodes 102, 202 and the semiconductor layer 300 and performing reactive ion etching to remove the dielectric material from the top of the electrodes 102, 202 and the semiconductor layer 300 to form the sidewall spacers on the sidewalls of the gate electrode materials 102, 202 only.

The gate electrode 102 and sidewall spacer 103 of the N-channel transistor 100 may be used as an implantation mask for doping the regions laterally adjacent to the gate electrode 102 in order to form source/drain regions. Source extension regions may be formed for both the N-channel transistor 100 and the intermediate P-channel transistor 200 in the manufacturing state shown in FIG. 2a. After formation of the source/drain regions of the N-channel transistor 100 (which may include an appropriate anneal treatment for activating the implants), silicidation for the N-channel transistor 100 is performed. During this silicidation process, the intermediate P-channel transistor 200 is masked by some appropriate mask layer to protect the intermediate P-channel transistor 200 against silicidation. Silicidation of the N-channel transistor 100 results in a silicidated top gate 104 and silicidated source/drain regions 105. The silicidation process may start with deposition of a metal film, typically nickel, followed by a heating step triggering a chemical reaction between the metal particles of the deposited film and the gate electrode 102 and source/drain regions formed in the semiconductor layer 300.

Subsequently, an interlayer dielectric material 400, for example, some oxide material, is formed over the entire structure that comprises the N-channel transistor 100 and the intermediate P-channel transistor 200 as well as the STI 310. It is essential that, at the manufacturing state shown in FIG. 2a, no source/drain regions provided in a semiconductor material different from the material of the semiconductor layer 300 are formed yet. This is completely different from the art wherein the interlayer dielectric 400 is formed on the already completed P-channel transistor 200 after formation of source/drain regions in an embedded semiconductor material.

In the manufacturing state shown in FIG. 2b, contact openings 410 are formed in the interlayer dielectric 400. The contact openings 410 are formed by etching using an appropriately patterned etching mask formed on top of the interlayer dielectric 400. By the etching mask opening, etching may be performed at some predetermined lateral distance from the sidewall spacer 203. The etching stops at the silicidated gate 104 and silicidated source/drain regions 105 of the N-channel transistor 100 and the silicidated gate 204 of the intermediate P-channel transistor 200. In particular, a first opening is formed in the interlayer dielectric 400 at a predetermined distance laterally spaced from the gate electrode 202 on one side of the gate electrode 202 (for example, on the left of the gate electrode 202 in FIG. 2b) and a second opening is formed in the interlayer dielectric 400 at a predetermined distance laterally spaced from the gate electrode 202 on another side of the gate electrode 202 (for example, on the right of the gate electrode 202 in FIG. 2b). Both the first and second openings reach to the semiconductor layer 300.

Adjacent to and laterally spaced from the sidewall spacer 203 of the intermediate P-channel transistor 200, the etching stops at some depth within the semiconductor layer 300. After completion of the etching of the contact openings 410, cavities 320 are etched through the contact openings 410 adjacent to the sidewall spacer 203 of the intermediate P-channel transistor 200 in the semiconductor layer 300, i.e., in the active region of the eventually completed P-channel transistor device. The cavities 320 may be formed to extend to the sidewall spacer 203 up to a predetermined distance.

As shown in FIG. 2c, the cavities 320 are filled with another semiconductor material 330 that is different from the material of the semiconductor layer 300. For example, the other semiconductor material 330 may comprise or consist of a silicon/germanium compound (alloy). In this case, optionally a silicon head 340 may be formed atop of the silicon/germanium compound 330 in order to facilitate the subsequent contacting. A silicon/germanium/tin alloy, a silicon/tin alloy and the like may alternatively be formed in the cavities 320, for example.

By localizing the regions of the embedded semiconductor material 330 through the contact openings 410, it can be avoided that the other semiconductor material 330 inappropriately grows at an interface of the semiconductor layer 300 and the STI 310. Thereby, problems of contact failure that conventional techniques suffer from (see description in introductory section) can reliably be avoided. When an embedded semiconductor material 330 with a larger lattice constant than the one of the semiconductor layer 300 is provided, a compressive strain may be induced in the channel region of the P-channel transistor 200, thereby enhancing the conductivity and performance of the same.

As mentioned above, a silicon/germanium compound may be chosen for the other semiconductor material 330. By adjusting the germanium content of the silicon/germanium compound, the strain level induced in the channel region of the P-channel transistor 200 may be controlled. For example, a germanium content of 20 atomic % to 30 atomic % can suitably be chosen to achieve a compressive stress level of about 1 GPa in the channel region of the P-channel transistor 200. The silicon/germanium compound (or other chosen material) may be epitaxially grown on the material of the semiconductor layer 300 within the cavities 320.

Optionally, a silicon cap layer 340 may be formed on the silicon/germanium compound 330. Before or after formation of the silicon cap 340, the silicon/germanium compound 330 may be doped by ion implantation in order to form source/drain regions for the P-channel transistor 200 in the embedded silicon/germanium compound 330. It is noted that the epitaxy growth may be performed in the presence of an appropriate dopant impurity (for example, in suit doping with boron ions) such that the silicon/germanium compound grows with a dopant for forming source/drain regions included. Anneal treatment for activating the dopants, either comprised in the epitaxially growing material or implanted after growth of the silicon/germanium compound 330, may be performed for activating the dopants suitably.

Figure 2D:
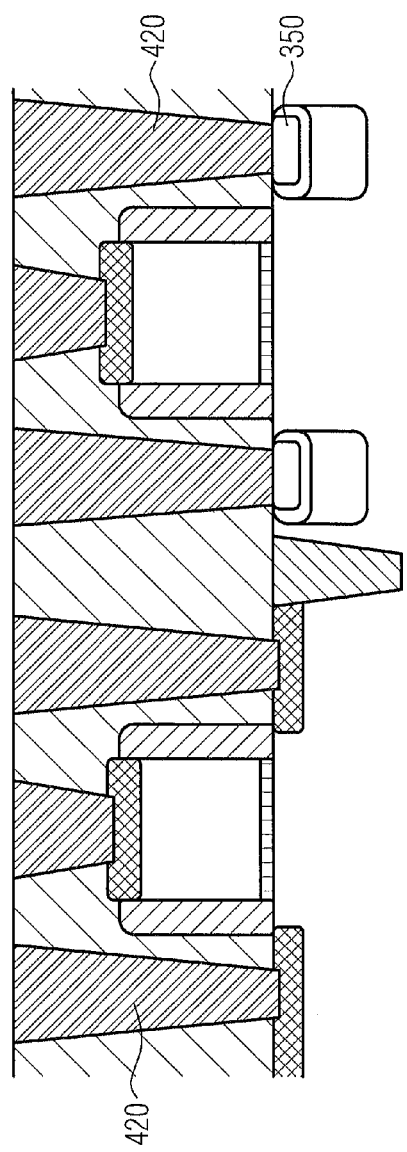

As shown in FIG. 2d, subsequently, a silicidation process is performed to reduce the contact resistivity of the drain and source. As a result of the silicidation process, silicidated source and drain regions 350 are formed. After completion of the formation of the P-channel transistor 200 by forming the embedded stress-inducing semiconductor material 330 and silicidation of the surface region of the embedded stress-inducing semiconductor material 330 or silicon cap 340, if provided, the contact openings 410 shown in FIGS. 2b and 2c are filled with a contact material 420, for example, a metal material, for instance aluminum. All silicided regions of the N-channel transistor 100 and P-channel transistor 200 are contacted by the contact material 420. In particular, reliable contacting of the silicidated source/drain region 350 of the P-channel transistor 200 in the vicinity of the STI 310 may be guaranteed by the inventive method.

As a result, the present disclosure provides manufacturing techniques for semiconductor devices comprising transistors.

Particularly, the provided manufacturing techniques allows for the formation of an embedded stress-inducing semiconductor material adjacent to a channel region for improving the conductivity of the same wherein the embedded stress-inducing semiconductor material is formed at a relatively late processing state, namely, after the formation of an interlayer dielectric. Since the embedded stress-inducing semiconductor material is formed through openings etched through the interlayer dielectric, defective growth of the embedded stress-inducing semiconductor material at an interface of the semiconductor layer wherein the embedded stress-inducing semiconductor material is grown and an STI may be avoided. Thereby, contacting may be improved and the risk of device failure may be reduced significantly.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor device, comprising the subsequently performed steps:
   forming a gate electrode on a first semiconductor material layer;
   forming an interlayer dielectric over said gate electrode and said first semiconductor material layer;
   forming a first opening in said interlayer dielectric at a predetermined distance laterally spaced from said gate electrode on one side of said gate electrode and a second opening in said interlayer dielectric at a predetermined distance laterally spaced from said gate electrode on another side of said gate electrode, said first and second openings reaching to said first semiconductor material layer;
   forming cavities in said first semiconductor material layer through said first and second openings formed in said interlayer dielectric; and
   performing at least one epitaxial growth process through said first and second openings to form embedded second semiconductor material layers in said cavities, said embedded second semiconductor material layers completely filling said cavities.

2. The method of claim 1, further comprising silicidating surface regions of said embedded second semiconductor material layers and filling a contact material into said openings after silicidating said surface regions.

3. The method of claim 1, wherein forming said embedded second semiconductor material layers comprises epitaxially growing lower portions of said second semiconductor material layers, epitaxially growing silicon caps on said lower portions, silicidating surface regions of said silicon caps, and filling a contact material into said openings after silicidating said surface regions.

4. The method of claim 1, further comprising forming sidewall spacers on sidewalls of said gate electrode, wherein said first opening is formed at a first predetermined lateral distance from said sidewall spacer on a first side of said gate electrode and said second opening is formed at a second predetermined lateral distance from said sidewall spacer on a second side of said gate electrode.

5. The method of claim 1, wherein said first semiconductor material layer comprises silicon and said embedded second semiconductor material layers comprise a silicon/germanium compound.

6. The method of claim 1, wherein said embedded second semiconductor material layers induce one of a compressive strain and a tensile strain in the channel region of said transistor device formed in said first semiconductor material layer.

7. A method of forming a semiconductor device, comprising:
   forming a first transistor in a first active region of a first semiconductor material layer;
   forming a shallow trench isolation in said first semiconductor material layer, said shallow trench isolation separating said first active region from a second active region;
   forming a gate dielectric layer above an upper surface of said first semiconductor material layer in said second active region;
   forming a gate electrode above said gate dielectric layer;
   forming an interlayer dielectric material over said first transistor and over said gate electrode and said upper surface of said first semiconductor material layer in said second active region;
   forming openings in said interlayer dielectric layer, wherein a first opening reaches a gate electrode of said first transistor, a second opening reaches a source region of said first transistor, a third opening reaches a drain region of said first transistor, a fourth opening reaches said gate electrode formed above said gate dielectric layer in said second active region, a fifth opening reaches said first semiconductor material layer in said second active region and is laterally spaced apart from a first side of said gate electrode, and a sixth opening reaches said first semiconductor material layer in said second active region and is laterally spaced apart from a first side of said gate electrode;
   forming a first cavity into said first semiconductor material layer through said fifth opening;
   forming a second cavity into said first semiconductor material layer through said sixth opening; and
   filling said first and second cavities with a second semiconductor material through said respective fifth and sixth openings.

8. The method of claim 7, further comprising filling a contact material in said first, second, third, fourth, fifth, and sixth openings.

9. The method of claim 8, further comprising silicidating surface regions of said second semiconductor material filled into said first and second cavities.

10. The method of claim 7, wherein at least one of said first and fourth openings reaches a silicidated gate electrode.

11. The method of claim 7, wherein filling said first and second cavities comprises forming a silicon cap in said first and second cavities.

12. The method of claim 7, further comprising incorporating dopants into said second semiconductor material filled into said first and second cavities in order to form source and drain regions of a second transistor in said second active region of said first semiconductor material layer.

13. A method of forming a semiconductor device comprising an N-channel transistor and a P-channel transistor, comprising the steps of:
   forming an isolation region separating a first active region from a second active region in a semiconductor layer;
   forming said N-channel transistor in and on said first active region comprising:
   forming a gate electrode of said N-channel transistor and forming sidewall spacers at sidewalls of said gate electrode of said N-channel transistor; and
   doping said semiconductor layer in said first active region to form source and drain regions;
   forming said P-channel transistor in and on said second active region comprising:
   forming a gate electrode of said P-channel transistor and forming sidewall spacers at sidewalls of said gate electrode of said P-channel transistor;
   and further comprising:
   forming a mask layer on said semiconductor layer in said second active region adjacent to said sidewall spacers of said gate electrode of said P channel transistor;
   silicidating said source and drain regions of said N-channel transistor, said gate electrode of said N-channel transistor and said gate electrode of said P-channel transistor in the presence of said mask layer prohibiting silicidation of said semiconductor layer in said second active region adjacent to said sidewall spacers of said gate electrode of said P channel transistor;
   forming an interlayer dielectric over said gate electrode and said source and drain regions of said N-channel transistor and over said gate electrode of said P-channel transistor and the surface of said semiconductor layer in said second active region adjacent to said sidewall spacers of said gate electrode of said P-channel transistor;
   forming first and second openings in said interlayer dielectric down to said semiconductor layer in said second active region adjacent to said sidewall spacers of said gate electrode of said P-channel transistor;
   forming a first cavity into said semiconductor layer in said second active region through said first opening;
   forming a second cavity into said semiconductor layer through said second opening; and
   filling said first and second cavities with a compressive strain-inducing semiconductor material.

14. The method of claim 13, further comprising forming additional openings to said source and drain regions of said N-channel transistor, said gate electrode of said N channel transistor and said gate electrode of said P-channel transistor and filling said additional openings with said compressive strain-inducing semiconductor material.

15. The method of claim 13, wherein filling said first and second cavities with said compressive strain-inducing semiconductor material comprises at least partially filling said first and second cavities with a semiconductor alloy comprising silicon and at least one of germanium and tin.

16. The method of claim 15, wherein filling said first and second cavities with said compressive strain-inducing semiconductor material further comprises forming a semiconductor cap layer comprising substantially silicon above said semiconductor alloy.

17. The method of claim 7, wherein filling said first and the second cavities with said second semiconductor material comprises forming a first type of semiconductor material in a lower portion of each of said first and second cavities and forming a second type of semiconductor material that is different from said first type of semiconductor material in a remaining portion of each of said first and second cavities.

18. The method of claim 17, wherein said first type of semiconductor material is a semiconductor alloy comprising silicon and at least one of germanium and tin and said second type of semiconductor material is substantially silicon.

19. The method of claim 1, wherein performing said at least one epitaxial growth process comprises performing a first epitaxial growth process to form a first type of semiconductor material in a lower portion of each of said first cavities and performing a second epitaxial growth process to form a second type of semiconductor material that is different from said first type of semiconductor material in a remaining portion of each of said first cavities.

20. The method of claim 19, wherein said first type of semiconductor material is a semiconductor alloy comprising silicon and at least one of germanium and tin and said second type of semiconductor material is substantially silicon.

\* \* \* \* \*